(12) United States Patent
Chen et al.

(10) Patent No.: US 8,476,769 B2
(45) Date of Patent: Jul. 2, 2013

(54) THROUGH-SILICON VIAS AND METHODS FOR FORMING THE SAME

(75) Inventors: Chih-Hua Chen, Taipei (TW); Chen-Shien Chen, Zhubei (TW); Chen-Cheng Kuo, Chu-Pei (TW); Kuo-Ching "Steven" Hsu, Chung-Ho (TW); Kai-Ming Ching, Jhudong (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 289 days.

(21) Appl. No.: 11/874,009

(22) Filed: Oct. 17, 2007

(65) Prior Publication Data

US 2009/0102021 A1   Apr. 23, 2009

(51) Int. Cl.
*H01L 29/01* (2006.01)

(52) U.S. Cl.
USPC .......................................... 257/774; 438/637

(58) Field of Classification Search
USPC ............................ 257/774, E25.013; 438/637
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,143,599 A * | 11/2000 | Kim et al. | 438/243 |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,208,838 B2 * | 4/2007 | Masuda | 257/774 |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,423,346 B2 * | 9/2008 | Lin et al. | 257/758 |
| 2003/0210534 A1 * | 11/2003 | Swan et al. | 361/807 |
| 2006/0049483 A1 | 3/2006 | Lin et al. | |

\* cited by examiner

*Primary Examiner* — Howard Weiss
*Assistant Examiner* — Steven Rao
(74) *Attorney, Agent, or Firm* — Slater & Matsil, L.L.P.

(57) ABSTRACT

An integrated circuit structure and methods for forming the same are provided. The integrated circuit structure includes a substrate; a through-silicon via (TSV) extending into the substrate; a TSV pad spaced apart from the TSV; and a metal line over, and electrically connecting, the TSV and the TSV pad.

27 Claims, 13 Drawing Sheets

US 8,476,769 B2

THROUGH-SILICON VIAS AND METHODS FOR FORMING THE SAME

TECHNICAL FIELD

This invention relates generally to integrated circuits, and more particularly to structures and manufacturing methods of through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Among the efforts for resolving the above-discussed limitations, three-dimensional integrated circuit (3DIC) and stacked dies are commonly used. Through-silicon vias (TSV) are often used in 3DIC and stacked dies for connecting dies. In this case, TSVs are often used to connect the integrated circuits on a die to the backside of the die. In addition, TSVs are also used to provide a short grounding path for grounding the integrated circuits through the backside of the die, which is typically covered by a grounded aluminum film.

FIG. 1 illustrates a cross-sectional view of an intermediate structure in the formation of a conventional TSV, wherein the intermediate structure includes silicon substrate 2, interlayer dielectric 4, and passivation layer 6. Electrode pad 8 is formed underlying passivation layer 6, and exposed through an opening in passivation layer 6. TSV 10 is formed through an opening in electrode pad 8 into interlayer dielectric 4 and silicon substrate 2.

The structure shown in FIG. 1 suffers from significant chip area penalty. Since the TSV is encircled by electrode pad 8, electrode pad 8 occupies a large chip area, and the corresponding chip area directly underlying electrode pad 8 cannot be used to form semiconductor devices. In addition, the formation of the TSV 10 involves forming and patterning a plurality of insulating films, and hence the manufacturing cost is high. New TSV structures and formation methods are thus needed.

SUMMARY OF THE INVENTION

In accordance with one aspect of the present invention, an integrated circuit structure includes a substrate; a through-silicon via (TSV) extending into the substrate; a TSV pad spaced apart from the TSV; and a metal line over, and electrically connecting, the TSV and the TSV pad.

In accordance with another aspect of the present invention, an integrated circuit structure includes a semiconductor substrate; a plurality of dielectric layers over the semiconductor substrate; a through-silicon via (TSV) penetrating the plurality of dielectric layers and the semiconductor substrate, wherein the TSV extends to a back surface of the semiconductor substrate; a TSV pad at a top surface of the plurality of dielectric layer, wherein the TSV pad is horizontally on only one side of the TSV pad; and a metal line overlying and electrically connecting the TSV pad and the TSV.

In accordance with yet another aspect of the present invention, a method of forming an integrated circuit structure includes providing a wafer, which includes a semiconductor substrate, and a through-silicon via (TSV) pad over the semiconductor substrate; forming a TSV opening extending from a top surface of the wafer into the semiconductor substrate, wherein the TSV opening is spaced apart from the TSV pad; forming a TSV in the TSV opening; and forming a metal line electrically connecting the TSV and the TSV pad.

In accordance with yet another aspect of the present invention, a method of forming an integrated circuit structure includes providing a wafer, which includes a semiconductor substrate, and a through-silicon via (TSV) pad over the semiconductor substrate; blanket forming a diffusion barrier layer over the wafer, wherein the diffusion barrier layer extends into a TSV opening; blanket forming a copper seed layer on the diffusion barrier layer; forming and patterning a mask layer, wherein the TSV pad, the TSV opening, and a region therebetween are exposed through the mask layer; selectively forming a copper layer on the copper seed layer, wherein the copper layer fills the TSV opening to form a TSV, and wherein the copper layer extends over the TSV pad; removing the mask layer to expose portions of the copper seed layer and the diffusion barrier layer underlying the mask layer; etching the exposed portions of the copper seed layer; and etching the exposed portions of the barrier layer.

The advantageous features of the present invention include reduced process steps, reduced manufacturing cost, and improved chip area usage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming through-silicon vias (TSV) is provided. The intermediate stages of manufacturing preferred embodiments of the present invention are illustrated. Throughout the various views and illustrative embodiments of the present invention, like reference numbers are used to designate like elements.

Figure 1:
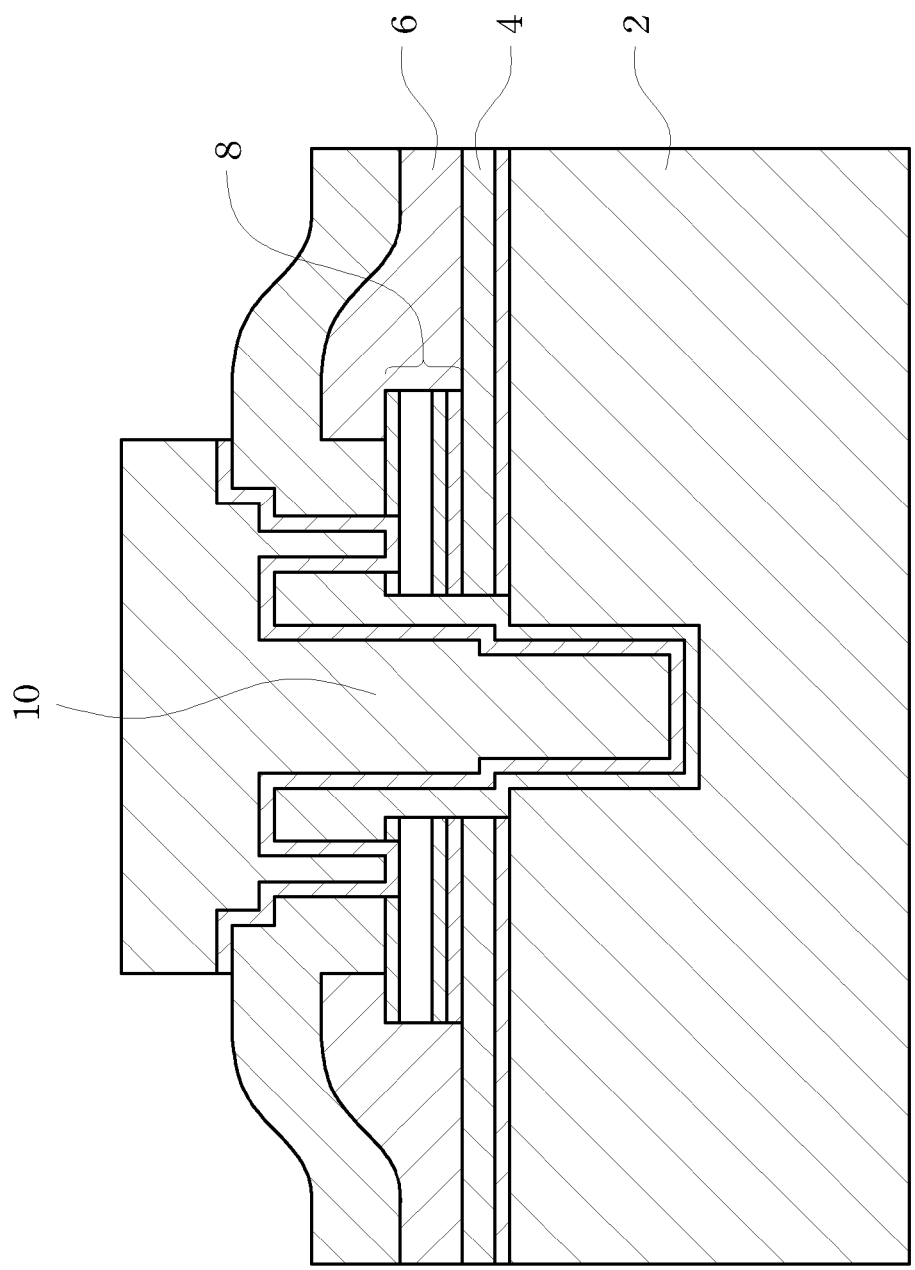
FIG. 1 illustrates a conventional through-silicon via structure, wherein the through-silicon via is formed through an opening in an electrode pad.
Figure 2:
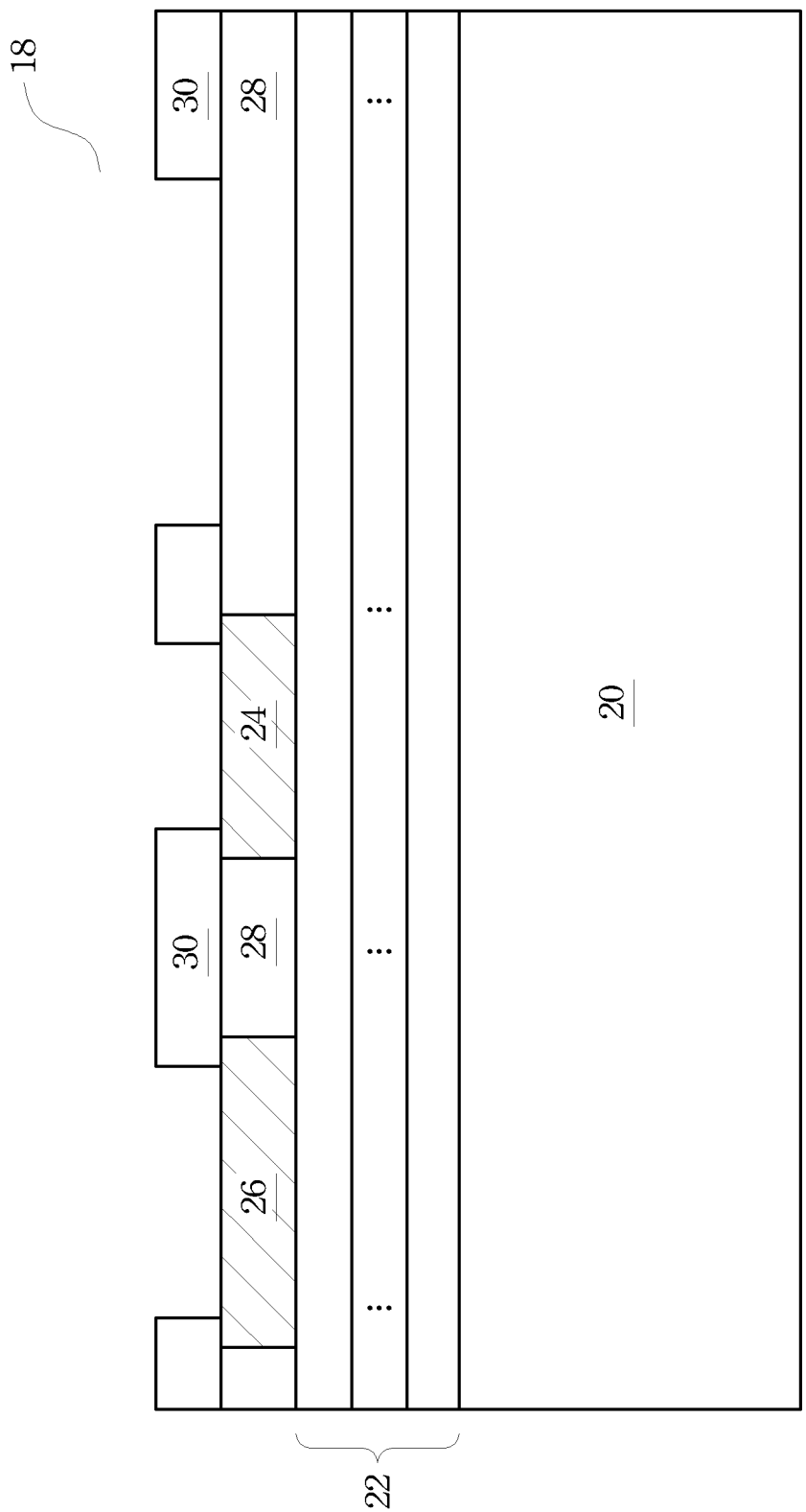
FIGS. 2 through 13 are cross-sectional views of intermediate stages in the manufacturing of an embodiment of the present invention, wherein a TSV is spaced apart from a TSV pad.

Referring to FIG. 2, wafer 18, which includes substrate 20, is provided. Substrate 20 is preferably a semiconductor substrate, such as a bulk silicon substrate, although it may include other semiconductor materials such as group III, group IV, and group V elements. Semiconductor devices, such as a metal-oxide-semiconductor (MOS, not shown) device may be formed at the top surface of substrate 20. Dielectric layers 22, which include metal lines and vias formed therein, are formed over substrate 20. Dielectric layers 22 may include commonly known interlayer dielectric and inter-metal dielectrics. As is known in the art, dielectric layers 22 may include low-k dielectric materials.

Through-silicon via (TSV) pad 24 is formed over dielectric layer 22. TSV pad 24 may be connected to the semiconductor devices at the top surface of substrate 20. FIG. 2 also illustrates bond pad 26, which may be used in the bonding process to connect the integrated circuits in the respective chip to external features. TSV pad 24 and bond pad 26 are formed in a top-level dielectric layer 28. The materials of TSV pad 24 and bond pad 26 may include metals selected from aluminum, tungsten, silver, copper, and combinations thereof. Passivation layer 30 is formed over TSV pad 24 and bond pad 26, which are exposed through openings in passivation layer 30. Passivation layer 30 may be formed of dielectric materials such as silicon oxide or silicon nitride.

Figure 3:
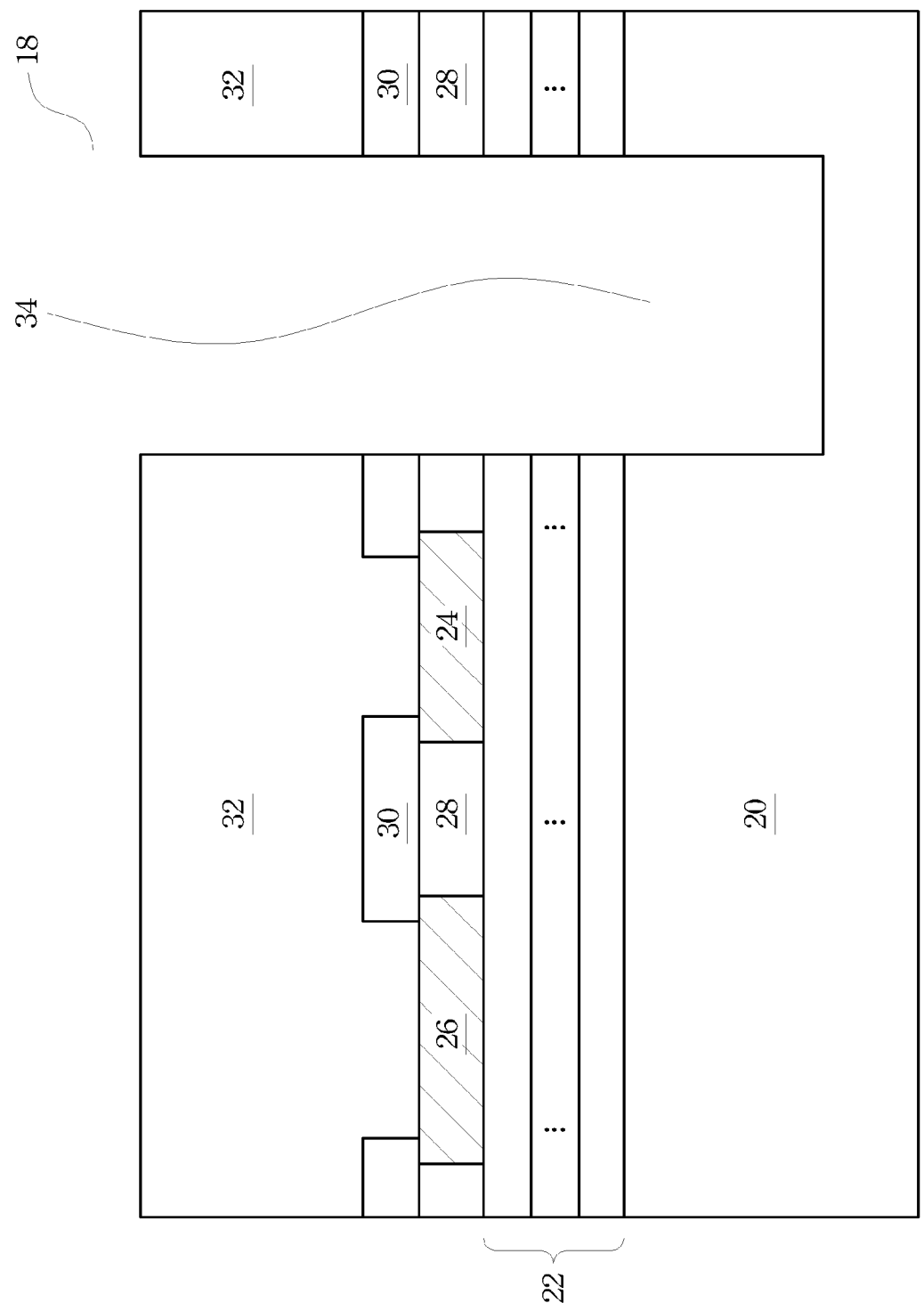
Figure 4:
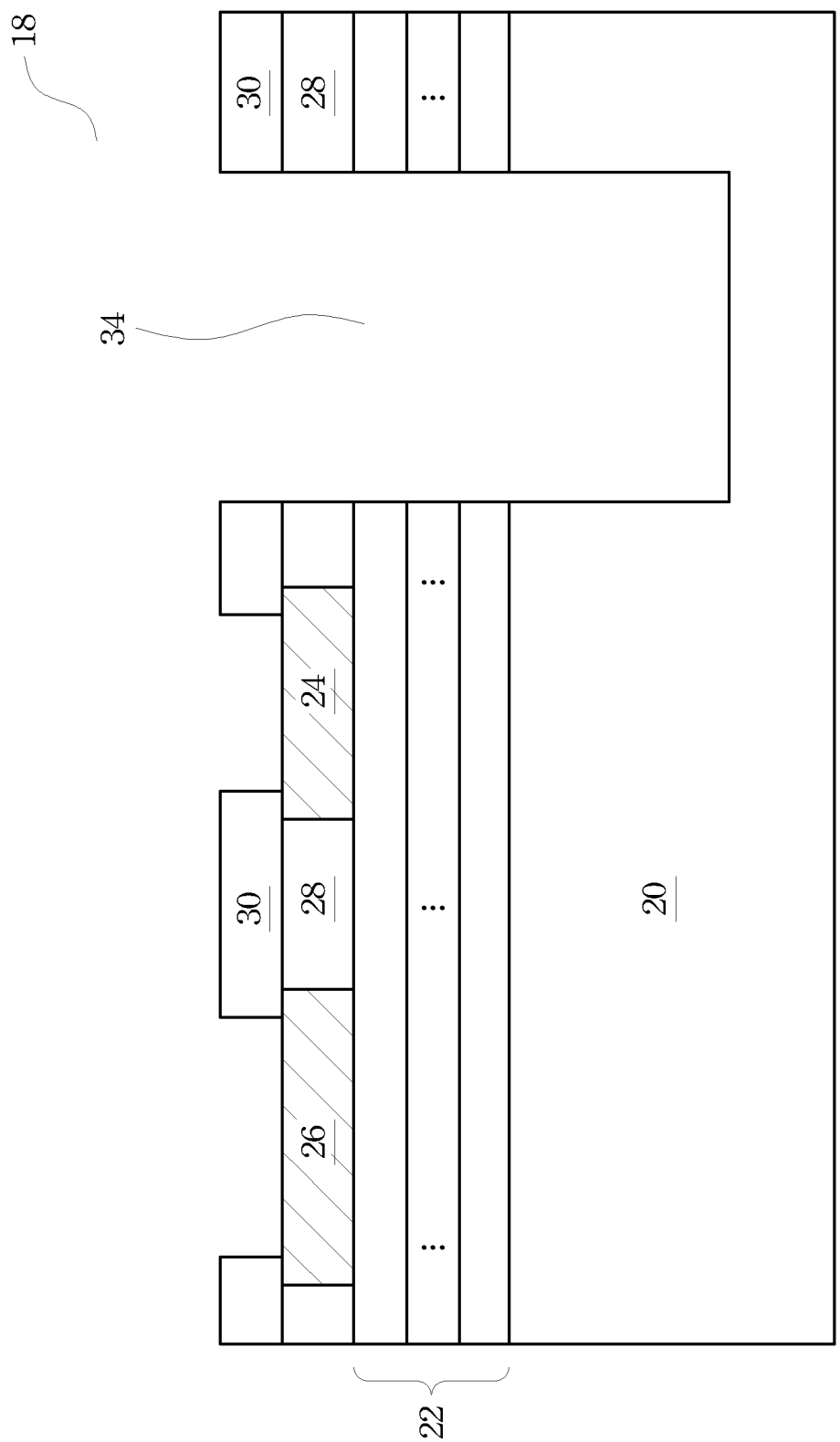

FIG. 3 illustrates the formation and patterning of photo resist 32, through which the underlying passivation layer 30 is exposed. A first etch is then performed to form opening 34 in passivation layer 30 and dielectric layers 28 and 22. Substrate 20 is then etched through opening 34, preferably using a dry etch. Undercuts may be undesirably formed in substrate 20 and at the interface between substrate 20 and the overlying dielectric layer 22. A second etch may then be performed to further etch dielectric layers 22, 28, and 30 in order to expand the upper portion of opening 34, so that the undercut is reduced. Preferably, the first and the second etches to dielectric layer 22, 28, and 30 are dry etches also. After the formation of opening 34, photo resist 32 is removed, and the resulting structure is shown in FIG. 4.

Figure 5:
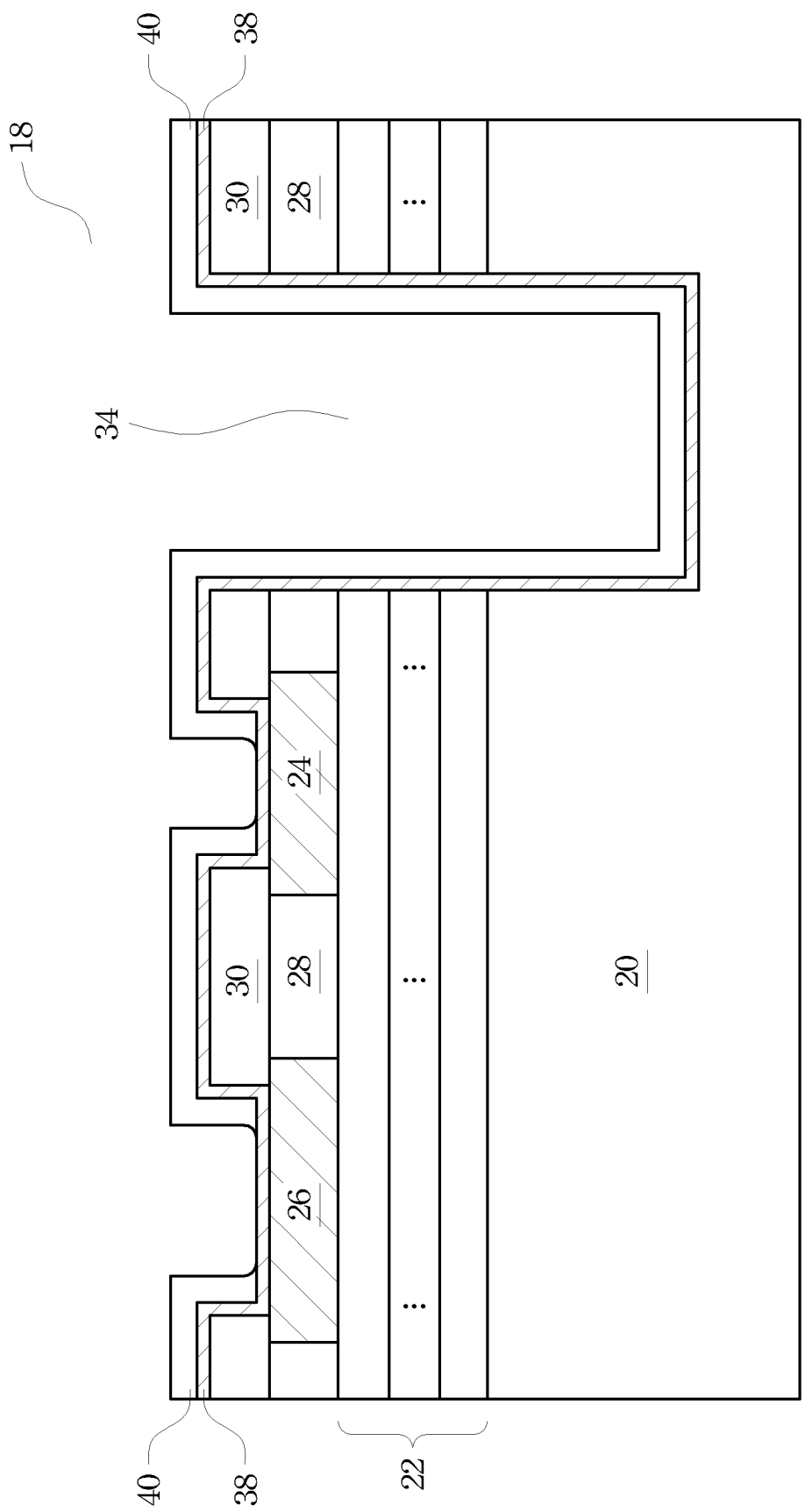
Figure 6:
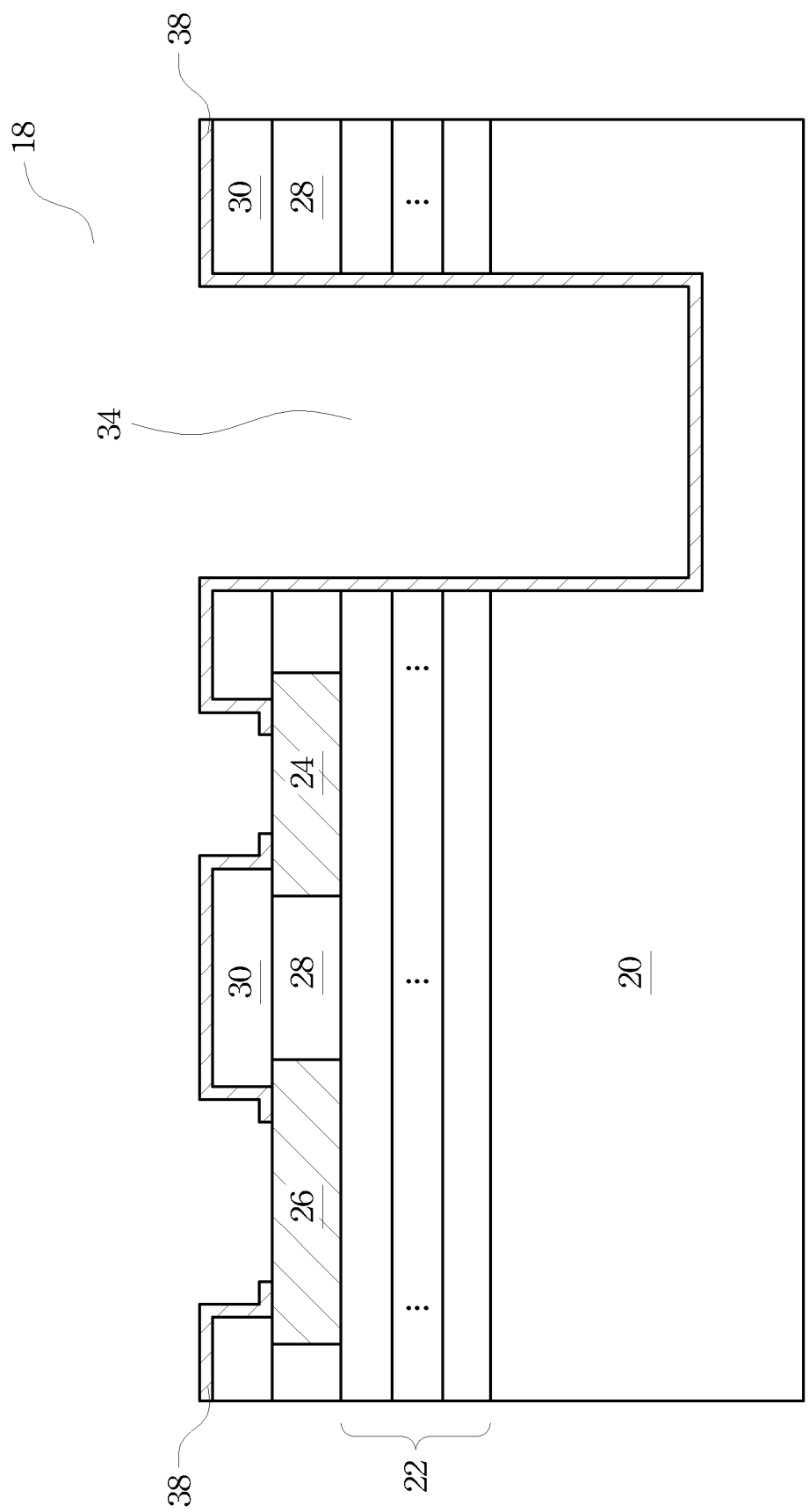

FIGS. 5 and 6 illustrate the formation of insulating layer 38. Referring to FIG. 5, insulating layer 38 is blanket formed. Insulating layer 38 may be formed of dielectric materials such as silicon nitride, silicon carbide, silicon oxynitride, and the like. Photo resist 40 is then applied and patterned. Preferably, photo resist 40 is a layer of spray coating. Photo resist 40 is then developed and patterned, with the portions directly over bond pad 26 and TSV pad 24 removed. The exposed portions of insulating layer 38 are then etched, exposing the underlying TSV pad 24 and bond pad 26. Photo resist 40 is then removed, resulting in a structure as shown in FIG. 6.

Figure 7:
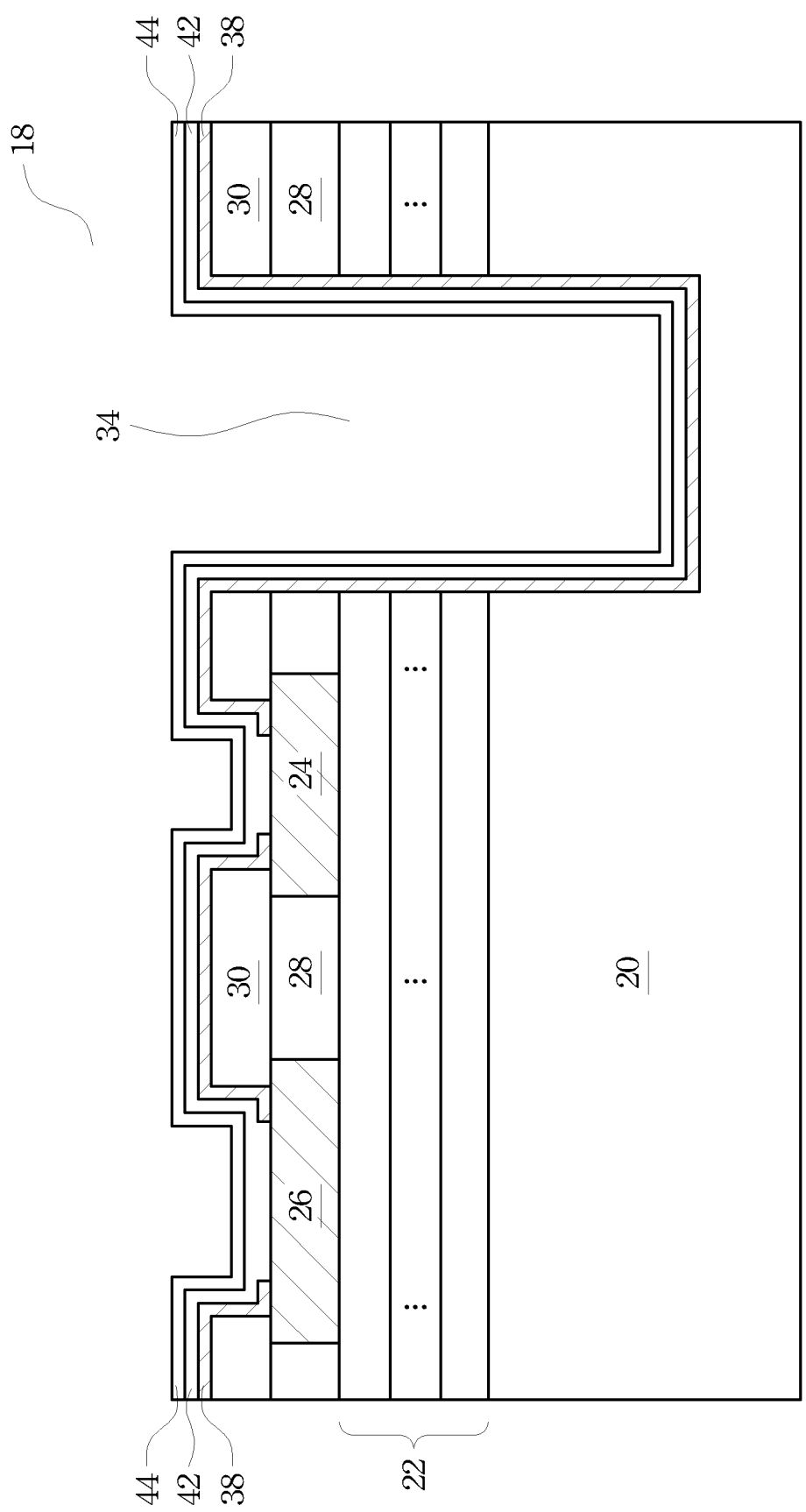

Referring to FIG. 7, diffusion barrier layer 42, also sometimes referred to as a glue layer, is blanket formed, covering the sidewalls and the bottom of opening 34. Diffusion barrier layer 42 may include titanium, titanium nitride, tantalum, tantalum nitride, and combinations thereof, and can be formed using physical vapor deposition, sputtering, and the like.

A thin seed layer 44, also referred to as an under-bump metallurgy (UBM), is blanket formed on diffusion barrier layer 42. The materials of seed layer 44 include copper or copper alloys, and metals such as silver, gold, aluminum, and combinations thereof may also be included. In an embodiment, seed layer 44 is formed using sputtering. In other embodiments, physical vapor deposition or electroless plating may be used. Thin seed layer 44 preferably has a thickness of less than about 2 μm.

Figure 8:
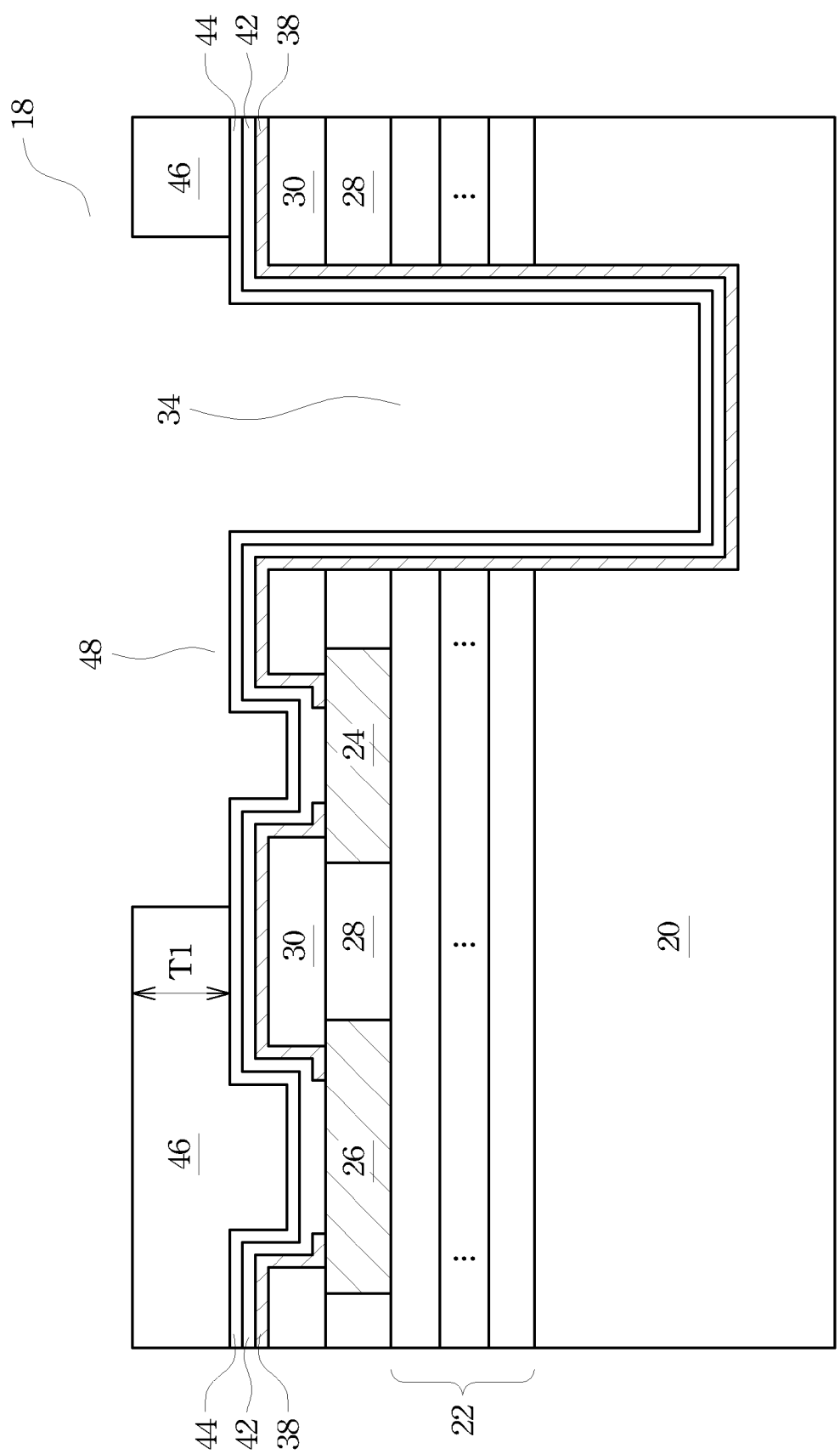

FIG. 8 illustrates the formation of mask 46. In the preferred embodiment, mask 46 is a dry film, and thus is referred to as dry film 46 throughout the description, although it may be formed of other materials. In an embodiment, dry film 46 comprises an organic material such as Ajinimoto buildup film (ABF). However, other materials such as Prepreg and resin-coated copper (RCC) can also be used. In the case dry film 46 is formed of ABF, the ABF film is first laminated on the structure shown in FIG. 7. Heat and pressure are then applied to the laminated film to soften it so that a flat top surface is formed. Thickness T1 of dry film 46 is preferably greater than about 5 μm, and more preferably between about 10 μm and about 100 μm. One skilled in the art will realize that the dimensions recited throughout the description are merely examples, and will be scaled with the down-scaling of integrated circuits.

Dry film 46 is then patterned. In an exemplary embodiment, the resulting TSV needs to be connected to the integrated circuits on the top surface of substrate 20 through TSV pad 24. Accordingly, opening 48 is formed in dry film 46, exposing portions of diffusion barrier layer 42 and seed layer 44 over TSV pad 24, opening 34, and the region therebetween.

Figure 9:
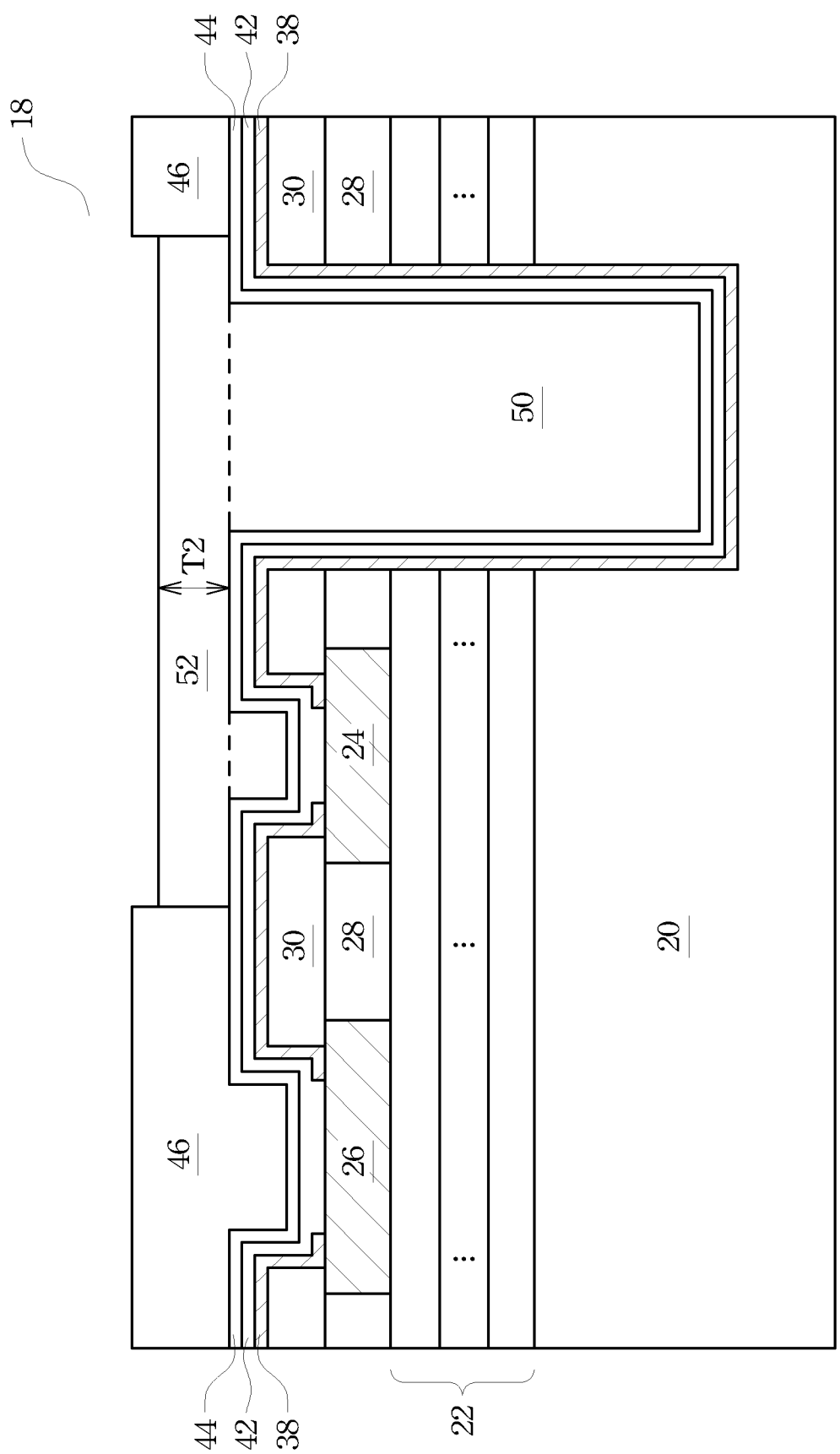

In FIG. 9, opening 34 is selectively filled with a metallic material, forming TSV 50 in opening 34. In the preferred embodiment, the filling material includes copper or copper alloys. However, other metals, such as aluminum, silver, gold, and combinations thereof, may also be used. The formation methods may be selected from sputtering, printing, electro plating, electroless plating, and commonly used chemical vapor deposition (CVD) methods.

Figure 10:
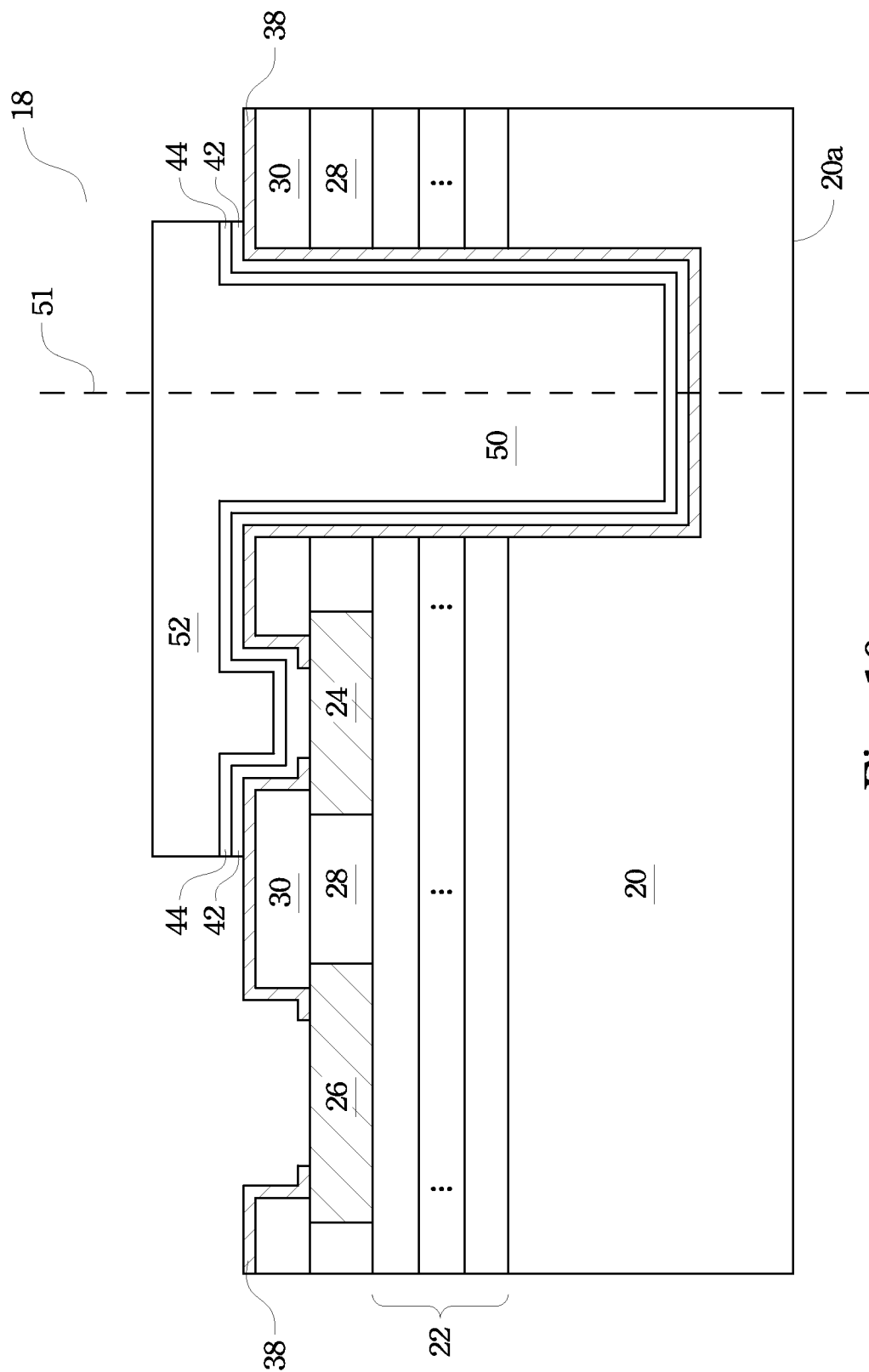

After opening 34 is filled, the same metallic material is continuously filled in opening 48 (refer to FIG. 8), forming metal line 52, also referred to as post-passivation interconnect (PPI) line 52, which electrically connects TSV pad 24 and TSV 50. Preferably, metal line 52 has a thickness T2 of less than about 30 μm, and more preferably between about 2 μm and about 25 μm. As shown in FIG. 10, TSV pad 24 is formed on one side, which is the left side in FIG. 10, (of axis 51) of TSV 50, but not on the opposite side, which is the right side in FIG. 10, (of central axis 51) of TSV 50, wherein central axis 51 is perpendicular to major surface 20a of substrate 20. Accordingly, TSV pad 24 is disposed only on one side of axis 51 of TSV 50, and does not encircle TSV 50.

In FIG. 10, dry film 46 is removed, for example, by an alkaline solution. As a result, the portions of UBM 44 underlying dry film 46 are exposed. The exposed portions of UBM 44 are then removed. Next, a pad-opening step is performed, and the exposed portions of diffusion barrier layer 42 are removed. Preferably, the etchant used for etching diffusion barrier layer 42 does not attack metal line 52. As a result, bond pad 26 is exposed. In an exemplary embodiment, the exposed portion of diffusion barrier layer 42 is removed using a fluorine-based etching gas, and the etching is preferably anisotropic. In following figures, seed layer 42 is not shown since it is typically formed of similar materials as TSV 50 and metal line 52, and thus it appears to be merged with TSV 50 and metal line 52.

Figure 11:
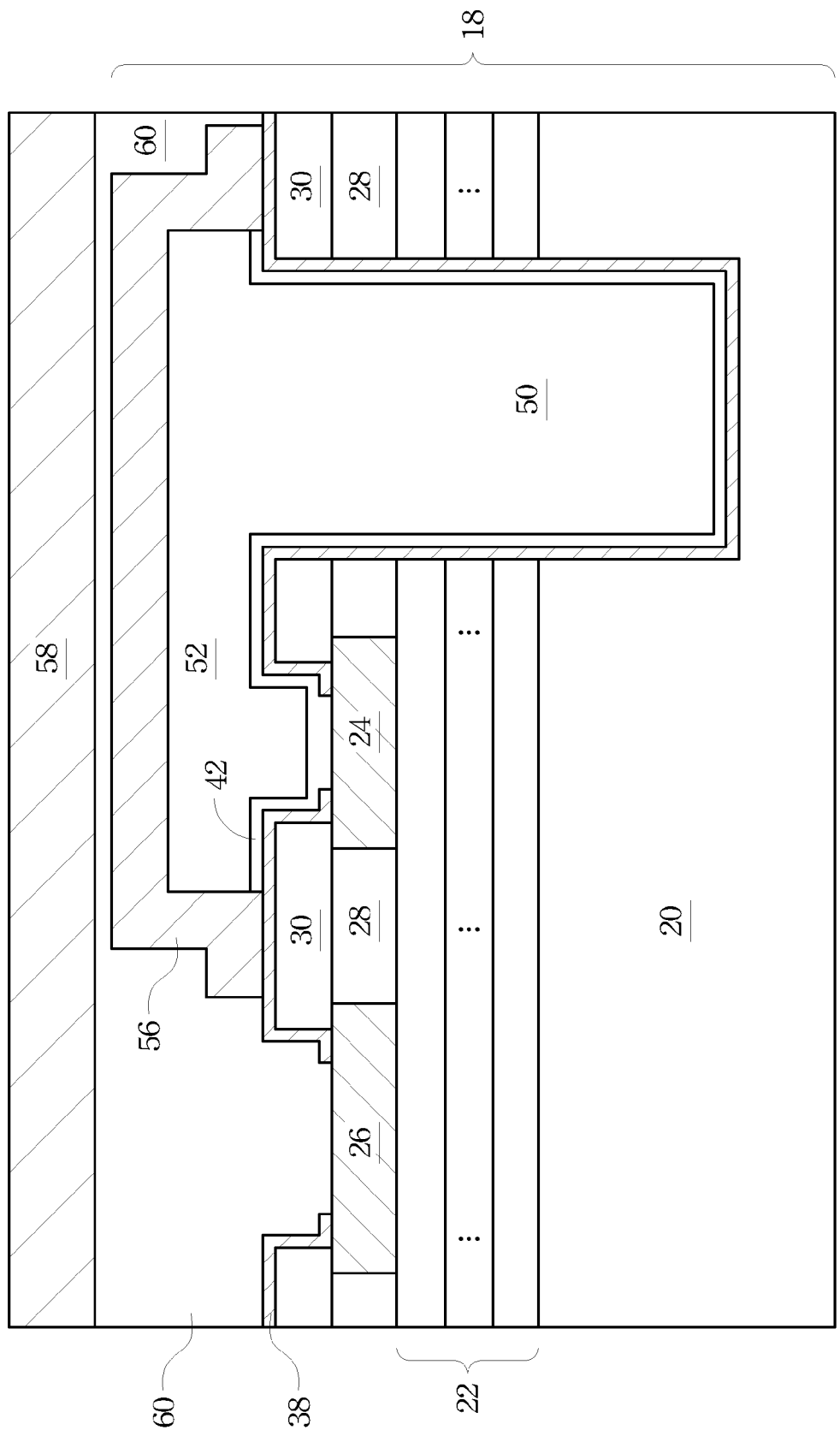

FIG. 11 illustrates the formation of solder mask 56, which is preferably blanket formed and then patterned to expose bond pad 26. Solder mask 56 may include an organic, and non-conductive material, commonly referred to as green paint. Metal line 52 and the underlying TSV 50 are covered by solder mask 56.

Figure 12:
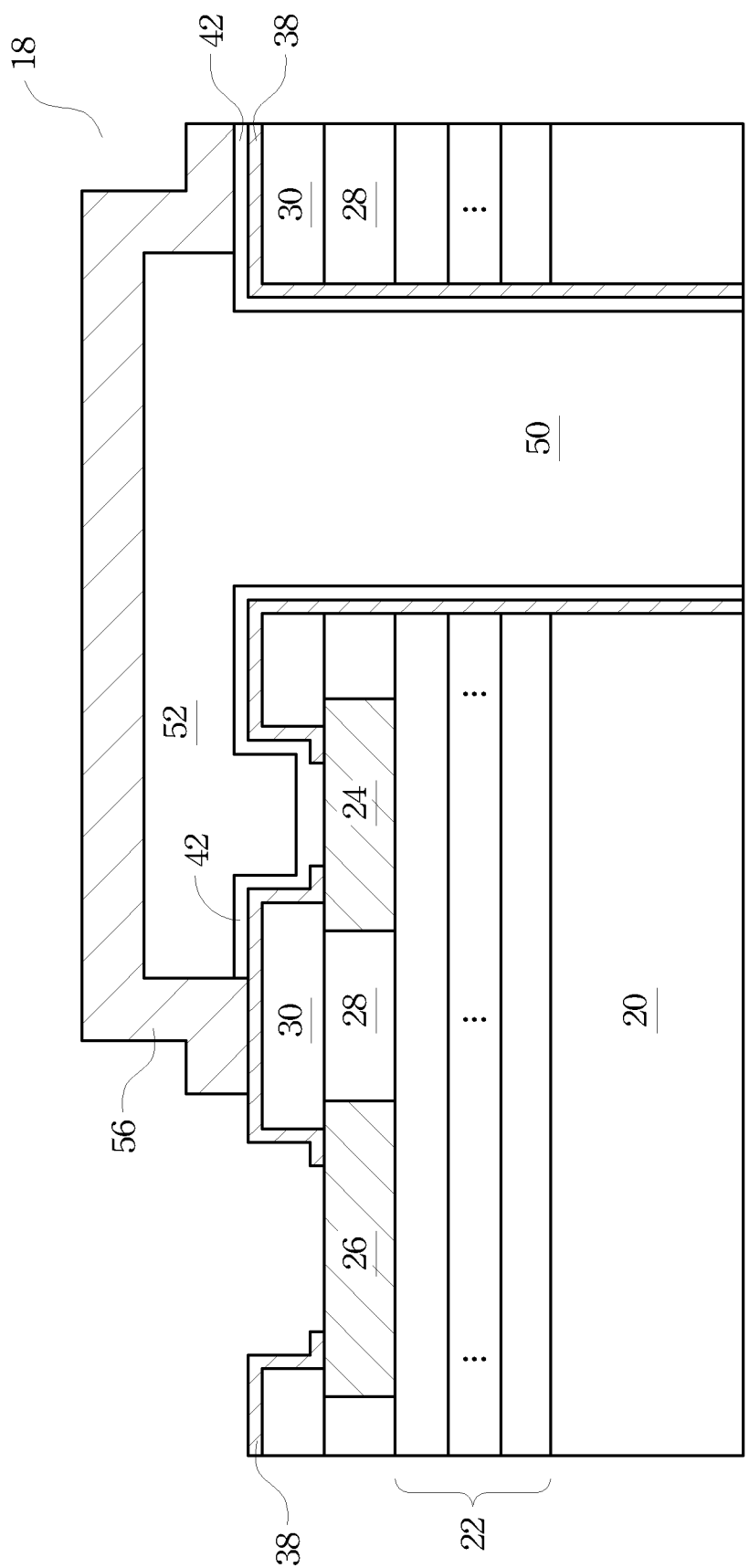

In subsequent steps, glass wafer 58 is mounted on the top surface of wafer 18 through ultra-violet (UV) glue 60. A wafer grinding is then performed to thin the back surface of substrate 20, until TSV 50 is exposed. Glass wafer 58 is then de-mounted by exposing UV glue 60 to an UV light, causing it to lose its adhesive property. The resulting structure is shown in FIG. 12.

Figure 13:
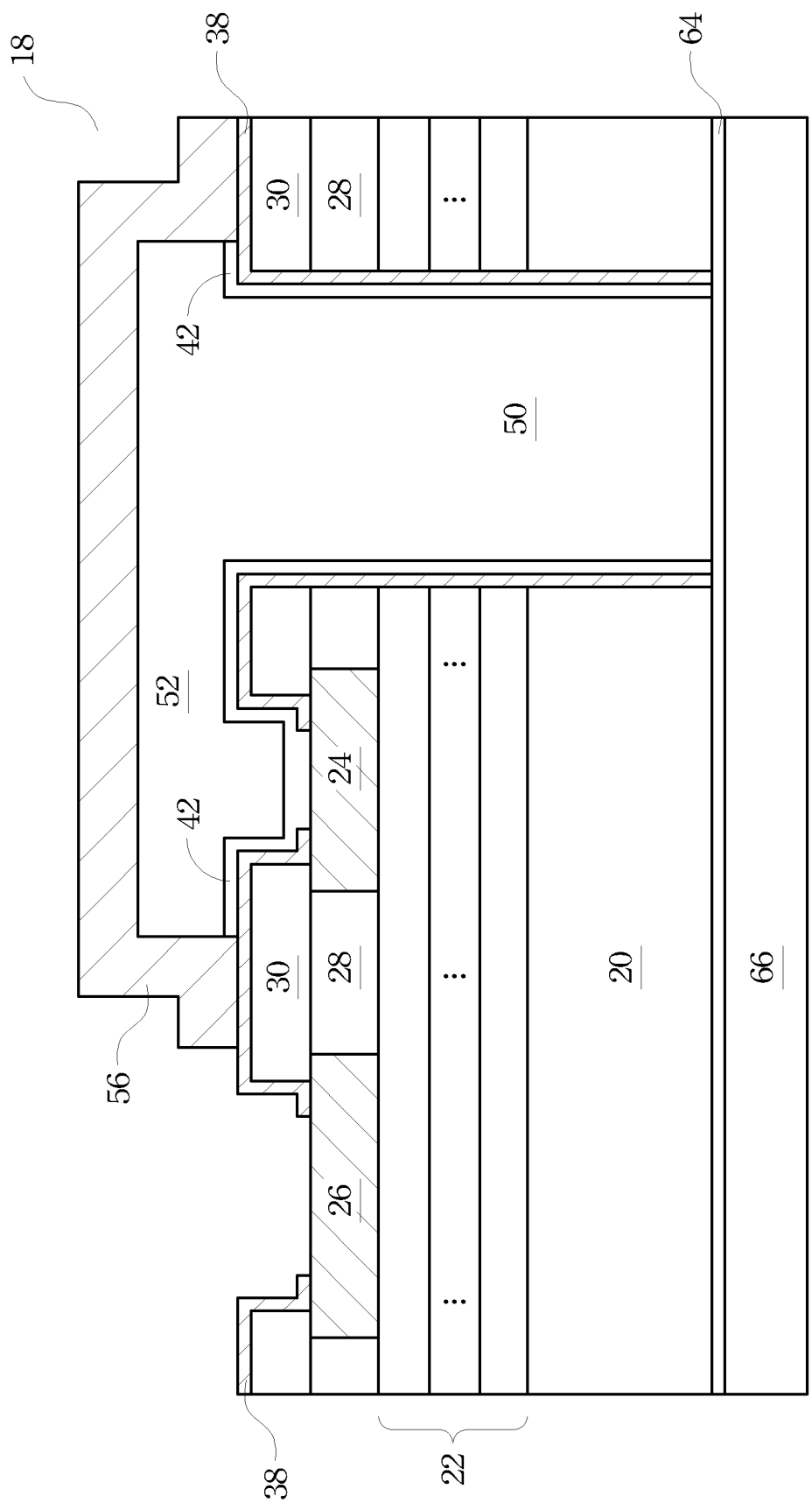

In FIG. 13, conductive layer 64, which may be an aluminum layer, is formed on the back surface of the wafer. Next, a nickel/silver alloy 66 is formed on conductive layer 64, for example, by electroless plating. Nickel/silver alloy 66 and conductive layer 64 are electrically connected to TSV 50. Accordingly, TSV 50 acts as an effective grounding path for the integrated circuit on the respective chip. In other embodiments, no conductive layers are formed on the back of wafer 18, and a bond pad may be formed on the exposed TSV 50, which bond pad may be electrically connected to another semiconductor chip or a package substrate. In yet other embodiments, no bond pad is formed on TSV 50, and TSV 50 may be connected to another semiconductor chip or a package substrate in the form of copper post.

The embodiments of the present invention have several advantageous features. Compared to conventional TSVs that penetrate through TSV pads, less chip area is needed since the TSV pad does not have to surround the TSVs. Further, the manufacturing process is simplified.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a substrate;
   a through-silicon via (TSV) formed of a conductive material extending into the substrate;
   a TSV pad spaced apart from the TSV, wherein the TSV pad is adjacent the TSV and on a first side, and not on a second side, of the TSV, wherein the first and the second sides are opposite to each other relative to an axis of the TSV, and are on a same side of the substrate, and wherein the axis is perpendicular to a major surface of the substrate; and
   a metal line over, and electrically connecting, the TSV and the TSV pad.

2. The integrated circuit structure of claim 1 further comprising an insulating layer separating the TSV from the substrate.

3. The integrated circuit structure of claim 2, wherein the TSV comprises a diffusion barrier layer adjoining the insulating layer.

4. The integrated circuit structure of claim 1 further comprising dielectric layers between the substrate and the metal line, wherein the TSV penetrates through the dielectric layers.

5. The integrated circuit structure of claim 1, wherein the TSV pad comprises a different material from the metal line.

6. The integrated circuit structure of claim 1 further comprising:
   a bond pad; and
   a solder mask covering the TSV pad and the metal line, wherein the bond pad is exposed through the solder mask.

7. The integrated circuit structure of claim 1 further comprising a conductive layer on a back surface of the substrate and electrically connected to the TSV.

8. The integrated circuit structure of claim 1, wherein the metal line and an inner portion of the TSV comprise a same material and form a continuous region.

9. An integrated circuit structure comprising:
   a semiconductor substrate;
   a plurality of dielectric layers over the semiconductor substrate;
   a through-silicon via (TSV) penetrating the plurality of dielectric layers and the semiconductor substrate, wherein the TSV is formed of a conductive material and extends to a back surface of the semiconductor substrate;
   a TSV pad directly over the plurality of dielectric layers, wherein the TSV pad is adjacent the TSV and on a first side, and not on a second side, of the TSV, wherein the first and the second sides are opposite to each other relative to an axis of the TSV, and are on a same side of the semiconductor substrate, and wherein the axis is perpendicular to a major surface of the semiconductor substrate; and
   a metal line overlying and electrically connecting the TSV pad and the TSV.

10. The integrated circuit structure of claim 9, wherein the metal line comprises a same material as an inner portion of the TSV.

11. The integrated circuit structure of claim 9 further comprising an insulating layer separating the TSV and the metal line from the semiconductor substrate and the plurality of dielectric layers, wherein the TSV is electrically connected to the metal line through an opening in the insulating layer.

12. The integrated circuit structure of claim 11, wherein the TSV comprises a diffusion barrier layer adjoining the insulating layer.

13. The integrated circuit structure of claim 9 further comprising a solder mask overlying the metal line.

14. The integrated circuit structure of claim 13 further comprising a bond pad in a same dielectric layer as the TSV pad, wherein the solder mask comprises an opening exposing the bond pad.

15. The integrated circuit structure of claim 9 further comprising a conductive layer on the back surface of the semiconductor substrate, wherein the TSV is electrically connected to the conductive layer.

16. A method of forming an integrated circuit structure, the method comprising:
   providing a wafer comprising:
      a semiconductor substrate; and
      a through-silicon via (TSV) pad over the semiconductor substrate;

forming a TSV opening extending from a top surface of the wafer into the semiconductor substrate, wherein the TSV pad is adjacent the TSV opening, and wherein the TSV opening does not extend through the TSV pad;

forming a TSV in the TSV opening; and forming a metal line electrically connecting the TSV and the TSV pad.

17. The method of claim 16, wherein the step of forming the TSV in the TSV opening comprises:

blanket forming a mask covering the wafer;

patterning the mask to expose the TSV opening, the TSV pad, and a region therebetween;

selectively filling a conductive material into the TSV opening to form the TSV, until a portion of the conductive material higher than a top surface of the TSV electrically connects the TSV pad and the TSV; and removing the mask.

18. The method of claim 17 further comprising, before the step of selectively filling the conductive material, blanket forming an insulating material, and patterning the insulating material to expose the TSV pad.

19. The method of claim 16 further comprising forming a solder mask covering the metal line.

20. The method of claim 19, wherein the wafer further comprises a bond pad in a same dielectric layer as the TSV pad, and wherein the method further comprises patterning the solder mask to expose the bond pad.

21. The method of claim 16 further comprising grinding a back surface of the wafer to expose the TSV through the back surface of the wafer.

22. The method of claim 21 further comprising, after the step of grinding, forming a conductive layer on the back surface of the wafer, wherein the conductive layer is electrically connected to the TSV.

23. A method of forming an integrated circuit structure, the method comprising:

providing a wafer comprising:
a semiconductor substrate; and
a through-silicon via (TSV) pad over the semiconductor substrate;

forming a TSV opening extending into the semiconductor substrate and adjacent the TSV pad, wherein the TSV pad is on a first side, and not on a second side, of the TSV opening, wherein the first and the second sides are opposite to each other relative to an axis of the TSV opening, and are on a same side of the semiconductor substrate, and wherein the axis is perpendicular to a major surface of the semiconductor substrate;

blanket forming a diffusion barrier layer over the wafer, wherein the diffusion barrier layer extends into the TSV opening;

blanket forming a copper seed layer on the diffusion barrier layer;

forming and patterning a mask layer, wherein the TSV pad, the TSV opening, and a region therebetween are exposed through the mask layer;

selectively forming a copper layer on the copper seed layer, wherein the copper layer fills the TSV opening to form a TSV, and wherein the copper layer extends over the TSV pad;

removing the mask layer to expose portions of the copper seed layer and the diffusion barrier layer underlying the mask layer;

etching the exposed portions of the copper seed layer; and etching the exposed portions of the diffusion barrier layer.

24. The method of claim 23 further comprising:

applying an ultra-violet glue on a top surface of the wafer;

mounting a glass wafer on the wafer using the ultra-violet glue; and grinding a backside of the wafer to expose the TSV.

25. The method of claim 23 further comprising, before the step of forming the diffusion barrier layer, forming an insulating layer, and patterning the insulating layer to expose the TSV pad.

26. The integrated circuit structure of claim 1, wherein the TSV pad does not encircle the TSV.

27. The integrated circuit structure of claim 9, wherein the TSV pad does not encircle the TSV.

* * * * *